United States Patent
Scherr

(10) Patent No.: US 7,982,483 B2
(45) Date of Patent: Jul. 19, 2011

(54) CIRCUIT AND METHOD FOR COMPONENT COMMUNICATION

(75) Inventor: Wolfgang Scherr, Landskron (AT)

(73) Assignee: Infineon Technologies AG, Neubiberg (DE)

( * ) Notice: Subject to any disclaimer, the term of this patent is extended or adjusted under 35 U.S.C. 154(b) by 1365 days.

(21) Appl. No.: 11/466,579

(22) Filed: Aug. 23, 2006

(65) Prior Publication Data

US 2007/0050690 A1     Mar. 1, 2007

(30) Foreign Application Priority Data

Aug. 24, 2005    (DE) .......................... 10 2005 040 074

(51) Int. Cl.
*G01R 31/02*    (2006.01)
*G01R 31/26*    (2006.01)
*G01R 31/28*    (2006.01)

(52) U.S. Cl. ................................. 324/762.01; 714/724

(58) Field of Classification Search .................. None
See application file for complete search history.

(56) References Cited

U.S. PATENT DOCUMENTS

| 6,292,009 | B1 | 9/2001 | Farnworth et al. | 324/765 |
| 6,968,484 | B2 | 11/2005 | Hummel | 714/721 |
| 7,009,417 | B2 | 3/2006 | Perner | 324/763 |
| 2004/0098699 | A1 | 5/2004 | Breejen et al. | 716/15 |
| 2004/0133829 | A1* | 7/2004 | Hummel | 714/724 |

FOREIGN PATENT DOCUMENTS

| DE | 19819265 C1 | 4/1998 |
| DE | 10248753 | 5/2004 |
| DE | 102004010852 | 11/2005 |

* cited by examiner

*Primary Examiner* — Roberto Velez
(74) *Attorney, Agent, or Firm* — Eschweiler & Associates, LLC

(57) ABSTRACT

A circuit has a supply voltage terminal for receiving a supply voltage of the circuit, wherein a trigger impulse is superimposed on the supply voltage. Further, the circuit has a signal terminal for outputting an output signal voltage of the circuit, wherein a bit of a data signal is superimposed on the output signal voltage. Further, the circuit has a detector for detecting the trigger impulse and for providing a trigger signal in response to the trigger impulse. An adjustment device of the circuit is implemented to extract the bit from the output signal voltage in response to the trigger signal, to receive the bit or to superimpose the output signal voltage with the bit of the data signal to output the bit.

19 Claims, 8 Drawing Sheets

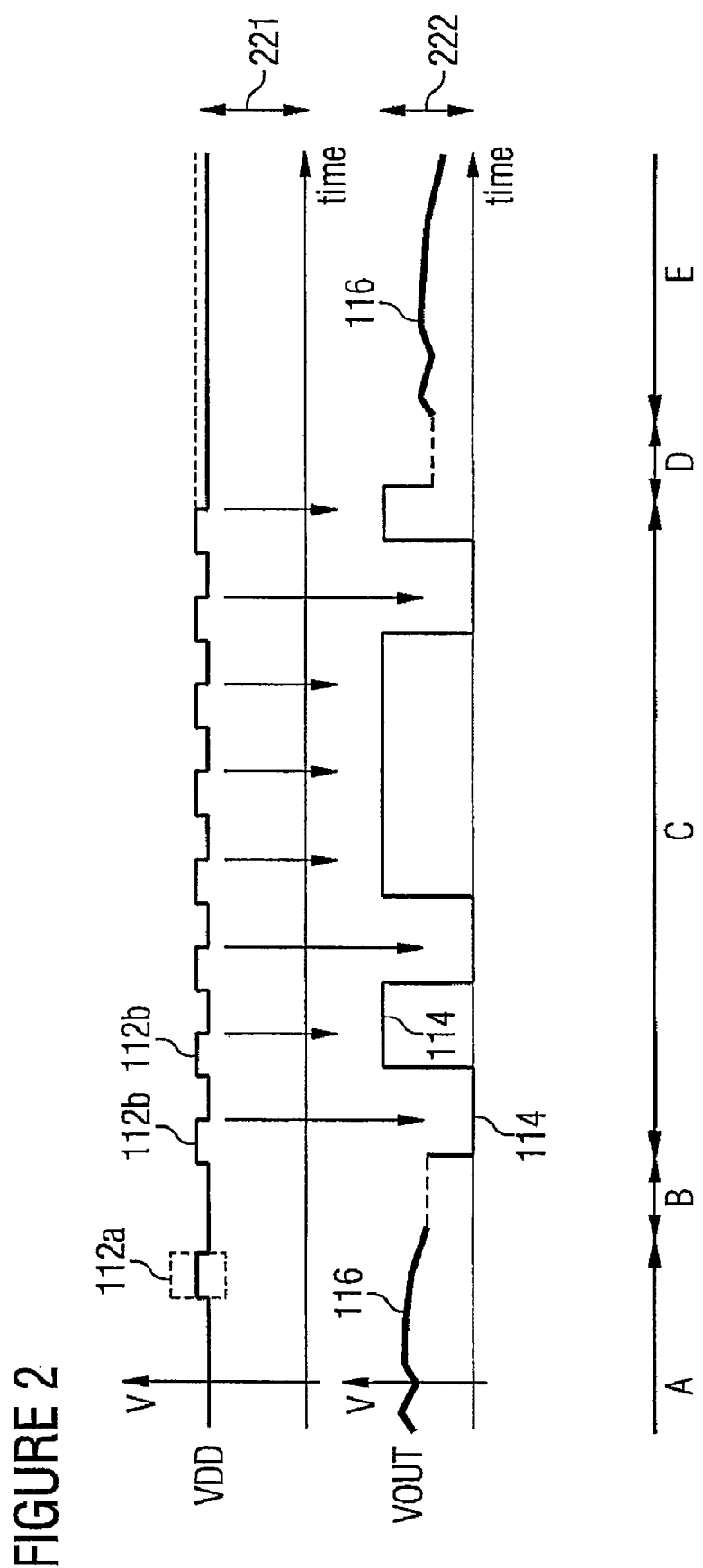

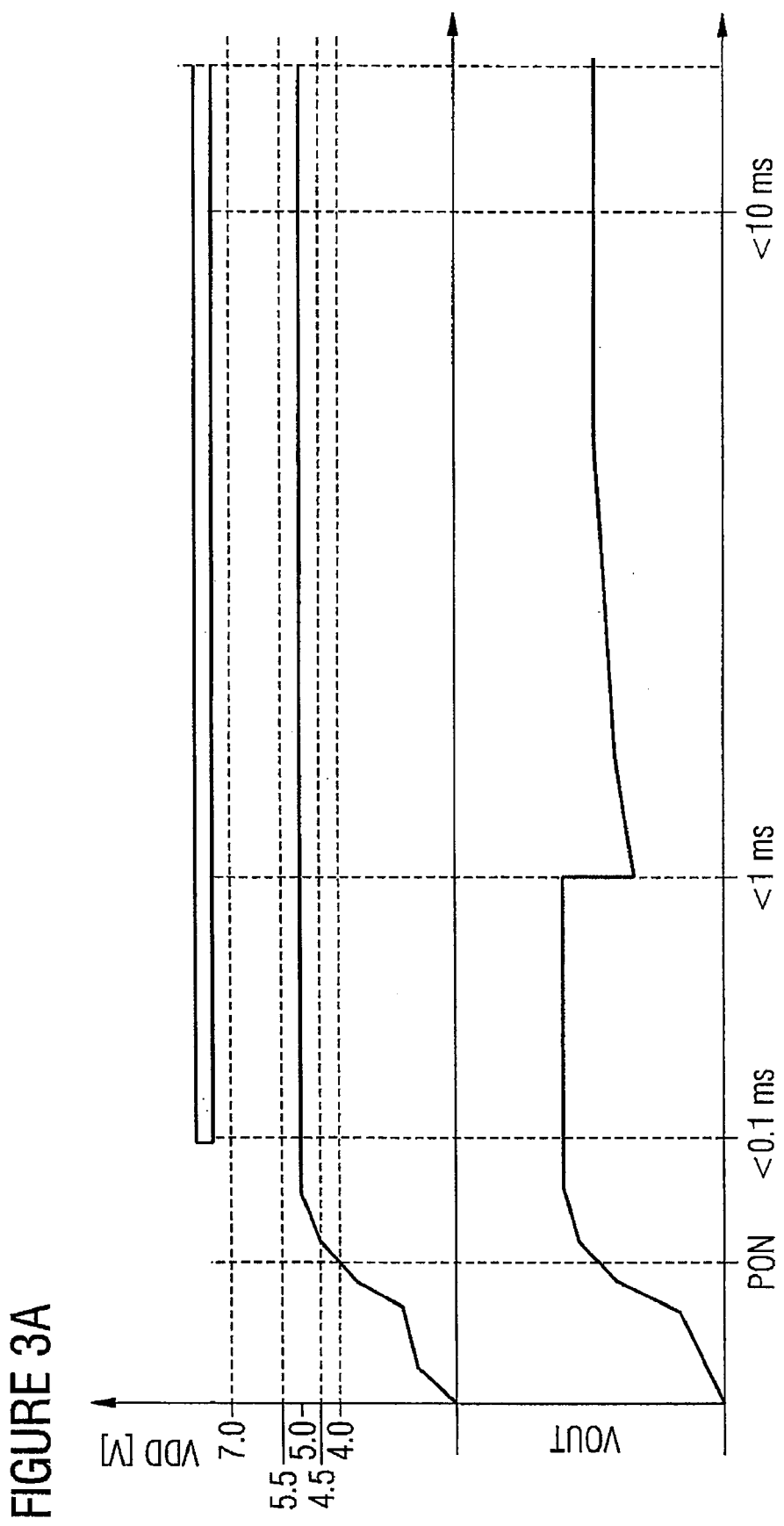

FIGURE 6A

| MSB | | | | | | | LSB |
|---|---|---|---|---|---|---|---|
| 1 | PO | PE | 0 | 0 | ADDR (6bit) | 1 0 | CMD (6bit) | 1 |

FIGURE 6B

| MSB | | | | | LSB |
|---|---|---|---|---|---|
| 1 | PO | PE | 0 | DATA (16bit) | 1 |

FIGURE 6C

| MSB | | | LSB |
|---|---|---|---|
| 1 | ADR (3 LSBs) | DATA (16bit) | 1 |

FIGURE 7

```
// count framedatabits from 0 (LSB) to 20 (MSB) - this are 21 bits
// bit 0 and 20 are always '1' (framebits)
pe = framedatabit(19);
po = 0;
for (i=1; i<17; i++)        // go through all data bits
    {   // handle even/odd separately
        if ((i&1)==1) {
           if (framedatabit(i)==1) { if (pe) pe=0; else pe=1; } // toggle pe
        } else {
           if (framedatabit(i)==1) { if (po) po=0; else pe=1; } // toggle po
        }
    }
framedatabit(17) = pe;
framedatabit(18) = po;
```

CIRCUIT AND METHOD FOR COMPONENT COMMUNICATION

PRIORITY

This application claims priority from German Patent Application No. DE 10 2005 040 074.4, which was filed on Aug. 24, 2005, and is incorporated herein by reference in its entirety.

TECHNICAL FIELD

The present invention report relates to a circuit and a method for secure component communication, which can particularly be used for components with low pin count.

BACKGROUND

Modern electric circuits or components have very complex internal functions, for example for digital/analog conversion, analog/digital conversion or for balancing of basic parameters of the components. Balancing of basic parameters can, for example, be performed via devices that are programmable one or several times, such as laser fuses, Zener zapping, cavity fuses or EEPROMs. However, sensor components in the magnetic range are mostly equipped with only a few pins. Reading out internal matter for test purposes or calibration or for writing with data is made much more difficult due to this bottleneck resulting from the few pins. Reading out internal matter should also be possible after housing the components. Thus, such processes are of importance, since some parameters can only be clearly defined and thus be programmed after a manufacturing process. This excludes the usage of laser fuses that can only be programmed on the chip.

Further, it has to be noted that the process of programming and reading out has sufficient interference immunity for industrial applications, has no unnecessary time losses due to speed or weighting times, and can no longer be activated later in the field, which would affect the basic function. However, the latter can be achieved by so-called "log bits", which are set at the end of the calibration and programming process in the parameter memory of the device.

Normally, such components have three pins, wherein during application, two pins serve for supplying voltage potential and reference potential, and one pin as output pin for analog or digital data transfer.

U.S. Pat. No. 6,292,009 B1 describes a method for deriving a clock signal from a supply voltage signal. Thereby, merely the possibility is described to transmit data serially via a modulation method on an existing line with a static signal, namely the supply line. Thereby, terminals are saved. The need to transfer data in an interference-proof way is not mentioned, since this may not be required in the shown applications, namely in a relatively well-defined test environment.

DE 198 19 265 C1 describes also a possibility to transmit data via a supply voltage signal to a component. Thereby, however, the supply signal is raised to a range outside the normal operating range, which cannot occur in the application case. Thereby, the operation of the component is substantially limited to the configuration of the component. Exact performance analyses, for example by reading out analog/digital converter values, are only possible in a limited way due to the altered supply voltage conditions.

In the known methods, a component is placed into a configuration mode, where configuration data can be transferred to the component, by superimposing specific signals on the supply voltage. This is critical, since an inadvertent activation of such a configuration mode can occur by interferences on the supply voltage. In order to avoid such an inadvertent activation, the supply voltage potential can be risen to a range outside the normal operating range.

This is particularly critical for sensor circuits with an analog output, where the analog output signal depends on a supply voltage of the circuit. By increasing the supply voltage, the analog output signal would be corrupted.

SUMMARY

In an embodiment, a circuit may have: a supply voltage terminal for receiving a supply voltage of the circuit, wherein a trigger impulse is superimposed on the supply voltage; a signal terminal for outputting an output signal voltage of the circuit, wherein a bit of a data signal is superimposed on the output signal voltage; a detector for detecting the trigger impulse and for providing a trigger signal, in response to the trigger impulse; and an adjustment means, which is implemented to extract the bit from the output signal voltage in response to the trigger signal, to receive the bit or to superimpose the output signal voltage with the bit of the data signal to output the bit.

In an embodiment, a method may have the steps of: a) receiving a supply voltage of a circuit via a supply voltage terminal, wherein a trigger impulse is superimposed on the supply voltage; b) outputting an output signal voltage of the circuit via a signal terminal of the circuit, wherein a bit of a data signal is superimposed on the output signal voltage; c) detecting the trigger impulse and providing a trigger signal in response to the trigger impulse; and d) extracting the bit from the output signal voltage in response to the trigger signal, to receive the bit, or superimposing the output signal voltage with the bit to output the bit.

BRIEF DESCRIPTION OF THE DRAWINGS

These and other objects and features of the present invention will become clear from the following description taken in conjunction with the accompanying drawings, in which:

FIG. 2 is a diagram for illustrating a component communication according to a embodiment;

FIGS. 3a and 3b are diagrams for illustrating a component communication according to further embodiments;

FIGS. 6a to 6c are transmission formats for component communication according to embodiments; and FIG. 7 is a description of a parity generator for usage in an embodiment.

DETAILED DESCRIPTION

Figure 1:
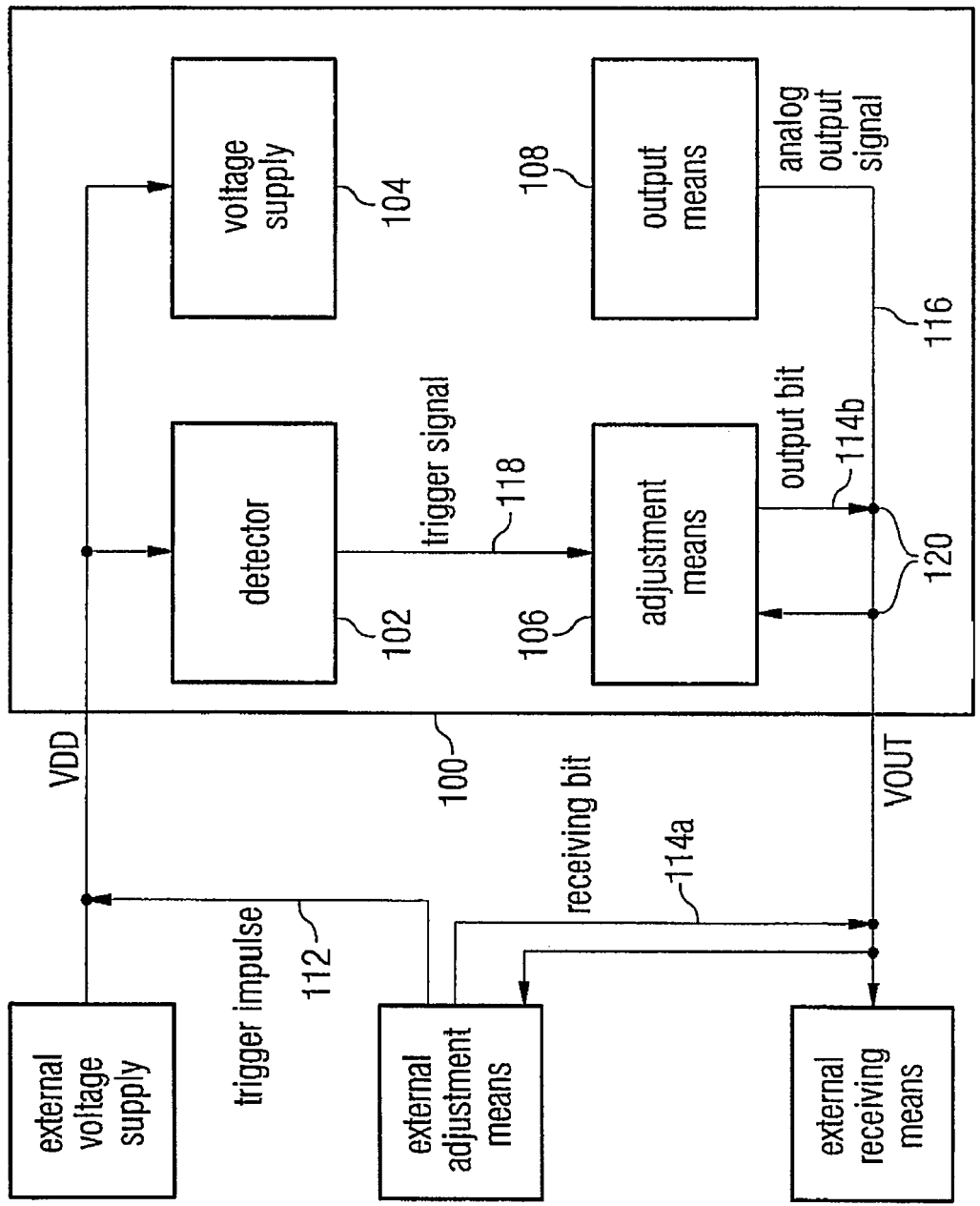
FIG. 1 is a schematic illustration of a circuit according to an embodiment.

The present embodiments allow secure component communication, even when, due to a low pin count, no pins that can exclusively be used for component communication are available in a component. Thereby, with few signal terminals, configuration, test and debugging of a component are enabled. According to the disclosed embodiments, apart from a supply voltage line, additionally, a second line, for example an output signal line of the component, is used for component communication. Thereby, a further signal for component communication is written over the pending output signal of the second line. The overwritable output signal of the second line can be a ratiometric analog signal. Thereby, the value of the analog signal, which means, for example, the output voltage, depends on the height of the supply voltage. Further, secure activation of a configuration mode of a circuit can be ensured in order to make the component robust against external influences in the application case. Particularly, the underlying method allows the activation of the configuration and test mode in a way such that afterwards the component remains with regard to its external terminals under nominal conditions. However, it is ensured that in the application case, this specific mode is also excluded with high probability due to interference effects.

The approach can also be used for components with merely three pins, wherein these three pins are a supply pin, an output pin for an analog output signal and a pin for a mixed reference potential or a ground terminal, respectively.

The approach allows to maintain the operating parameters of the circuit, particularly the level of the supply voltage, also in the configuration mode, which means in the mode where data communication takes place, in an unaltered way. This allows to operate the component under normal conditions, even in the configuration mode, and particularly, to output the ratiometric analog output signal in an uncorrupted way, as long as no datum is overwritten. Thus, an aspect according to the embodiments consists also in performing the activation of the configuration mode or test mode without changing the nominal operating parameters of the circuit. This takes place by short-term superimposition of redundant and/or error-corrected data via the output quantities of the component.

By transmitting additional superimposed signals both on the supply voltage line and on a second line, the reliability of communication can be increased. This can be achieved by effecting activation of a specific mode of the circuit or receiving or outputting of data, respectively, only when the signals transmitted via both lines match. If an output signal of the circuit is used as second signal, further error protection results in that the datum transmitted for communication has to be written over an output voltage driven by the component. The power required for overwriting the driven output voltage may be typically not reached by interference effects. This is particularly the case when a sufficiently high signal-to-noise ratio is chosen, i.e. when the digital level of the overwriting datum is very close to the supply voltage or the ground potential, respectively. The same applies for the selection of a high clock detection threshold, when a clock signal is transmitted via the supply voltage. If the supply voltage terminal is used to superimpose a trigger impulse on the supply voltage, the usage of a pin with ratiometric output as a second line contributes to further error protection. In this case, a pulse leads to an increase of the ratiometric output signal. For data transfer, this increase has to be counteracted by an external driver on the second line.

If a clock is transmitted via the supply voltage line, the circuit is also operable without internal clock generator. Apart from technological or physical limits, there are no limitations in data rate. For further protection, data to be transmitted can be protected with frame bits and security bits. Further, an access to cascaded components is also possible with a common supply line. The described method for communication with a component is not only possible during or directly after the production of the component, but also in an application circuit. A simple and interference-free protocol can be used for communication with the component. If the interferences on the supply line are only interferences with a frequency, suppression in the circuit can be adjusted thereon, when the interference in the component has to be minimized.

In the following description of embodiments, equal or similar reference numbers are used for the similar elements illustrated in different drawings, wherein a repeated description of these elements is omitted.

FIG. 1 shows a circuit 100 according to an embodiment. The circuit 100 has a detector 102, a voltage supply 104, an adjustment means 106 and an output means 108. Further, the circuit 100 has a first input for receiving a supply voltage VDD and a second terminal for outputting an output signal voltage VOUT. A trigger impulse 112 can be superimposed on the supply voltage VDD. A bit of a data signal can be superimposed on the output signal voltage VOUT, wherein the same can be a bit 114a, which is received by the circuit 100, or a bit 104b, respectively, which is output from the circuit 100.

The detector 102 as well as the voltage supply 104 is implemented to receive the supply voltage VDD. Therefore, both the detector 102 and the voltage supply 104 are connected to the first voltage terminal for receiving the supply voltage VDD. The voltage supply 104 is a means for supplying the voltage 100 with the supply voltage VDD. The detector 102 is implemented to detect a trigger impulse 112 on the supply voltage VDD. As consequence of a detected trigger impulse 112, the detector 102 supplies a trigger signal 118 to the adjustment means 106.

Both the output means 108 and the adjustment means 106 are connected to the second signal terminal for outputting the output signal voltage VOUT. The output means 108 is implemented to provide an analog output signal 116 of the circuit in the form of the output signal voltage to the second signal terminal. If the circuit 100 is a sensor, the analog output signal 116 can, for example, represent a value of a measured physical quantity. The adjustment means 106 is connected to the analog output terminal 116 via a coupling means 120. This allows the adjustment means 106 to receive or send, respectively, bits 114a, 114b, which are superimposed on the output signal voltage VOUT. With regard to the superimposed bit 114a, 114b, the second signal terminal is a bidirectional signal terminal. For receiving the bit 114a, the adjustment means 106 is implemented to extract the bit 114a to be received from the output signal voltage VOUT, as consequence of the trigger signal 118. For outputting the bit 114b, the adjustment means 106 is implemented to superimpose the bit 114b to the output signal voltage VOUT, as consequence of the trigger signal 118.

The circuit 100 can be connected to external means. Exemplarily, an external voltage supply for providing the supply voltage VDD to the circuit 100 is shown in FIG. 1. Further, an external receiving means is shown, which is implemented to receive the output signal voltage VOUT, and to evaluate the same, for example. Further, an external adjustment means is shown in FIG. 1. According to this embodiment, the external adjustment means is implemented to provide the trigger impulse 112 and to superimpose the same on the supply voltage VDD. Further, the external adjustment means is implemented to provide the bit 114a to be received by the circuit 100 and to superimpose the same on the output signal voltage VOUT. Also, the external adjustment means is implemented to receive the output signal voltage VOUT, to evaluate a bit output by the circuit 100, which is superimposed on the output signal voltage VOUT.

According to this embodiment, the supply voltage VDD is stepped-up by the trigger impulse 112 for the period of the trigger impulse. The detector 112 is implemented to provide the trigger signal 118 when the supply voltage VDD reaches or exceeds a trigger voltage value. Therefore, the detector 102 can have a comparison means, which compares the supply voltage VDD continuously or during a predetermined time period with the trigger voltage value. Alternatively, the trigger impulse 112 could also decrease the supply voltage. If the trigger impulse 112 has a short time period, its influence on the average value of the supply voltage VDD has no effect. Alternatively, the voltage supply 104 can also be implemented to filter out the trigger impulse 112.

The bit 114a, 114b can have a first logic value or a second logic value. By superimposing the bit 114a, 114b on the output signal voltage VOUT, the output signal voltage VOUT has an upper data voltage value or a lower data voltage value, respectively, during the superimposition with a bit 114a, 114b. The upper or lower data voltage value, respectively, is associated with the first logic value or the second logic value, respectively, or vice versa. Thus, for receiving the bit 114a, the adjustment means 106 is implemented to evaluate the output signal voltage VOUT and to provide the first logic value to the circuit 100, when the output signal voltage VOUT reaches or exceeds the upper data voltage value, and to provide the second logic value to the circuit 100, when the output signal voltage VOUT reaches the lower data voltage value or falls below the same. For outputting the bit 114b, the adjustment means is implemented to impress the upper data voltage value on the output signal voltage VOUT for outputting the first logic value, and to impress the second logic value on the output signal and to impress the lower data voltage value on the output signal VOUT for outputting the second logic value.

The coupling means 102 can be a simple power node or modulation means. During the time when a bit 114a, 114b is superimposed on the output signal voltage VOUT, both the output means 108 drives the analog output signal 116 on the output signal voltage VOUT, and the adjustment means 106 or the external adjustment means, respectively, in dependence on the logic value of the bit to be transmitted, the upper data voltage value or the lower data voltage value to the output signal voltage VOUT.

The circuit 100 can have a normal operating mode and a test mode or a configuration mode, respectively. In the normal operating mode, the circuit 100 is implemented to output the analog output signal 116 as output signal voltage VOUT. In the test or configuration mode, the circuit 100 is additionally implemented to receive or transmit, respectively, a bit 114a, 114b. Also, the circuit 100 is implemented in the test mode or configuration mode to receive a trigger impulse 112, which is superimposed on the supply voltage. In the normal operating mode, the circuit 100 can be implemented to receive a trigger impulse 112 on a supply voltage. This can be required when the circuit 100 is to be placed into the configuration mode or test mode, respectively, from the normal operating mode. If no transition is to take place from the normal operating mode to the test mode or configuration mode, for example, the detector 102 can be deactivated. Thereby, the circuit 100 is no longer able to receive a trigger impulse 112 and thus no longer able to receive or output a bit 114a, 114b.

The deactivation can only be made generally and permanently by programming, as a so-called "inhibit bit" or "lock bit" at the end of test and programming cycle—as long as configurable non-volatile memory is available, or due to an error signal by a higher order protocol, as will be described in the following discussion. By the latter measure, in the interference case—after an erroneously detected communication, which has been detected by these further error protection mechanisms—further erroneous interface accesses can be reliably prevented during operation. This barrier would then, for example, remain until the whole circuit has been fully restarted, for example by removing and reapplying the operating voltage.

FIG. 2 shows a component communication via the supply voltage VDD and the output signal voltage VOUT according to an embodiment. Therefore, a plurality of trigger impulses 112a, 112b are superimposed on the supply voltage VDD, and a plurality of bits 114 are superimposed on the output signal voltage VOUT. In FIG. 2, merely the first three trigger impulses are provided with reference numbers 112a, 112b, and the first two bits with reference numbers 114.

In a first phase A, the circuit is in normal operation. This means, the output means outputs the analog output signal 116 as output signal voltage VOUT. The following data transmission is initiated by the first trigger impulse 112a. According to this embodiment, no bit is transmitted during the first trigger impulse 112a. Alternatively, the data transmission can also take place simultaneously with the first trigger impulse 112a. As a consequence of the first trigger impulse 112a, the output signal voltage VOUT can be in a HI-Z-state in a second phase B. This phase can be triggered by the fact that the external or internal adjustment means, respectively, begins to drive the upper or lower data voltage value, respectively, to impress the bit to be transmitted on the output signal voltage. In a third phase C, the data input or data output operation follows, respectively. Therefore, a bit 114 is transmitted to every trigger impulse 112b. In a trigger impulse, the voltage range 221 of the supply voltage signal VDD is increased by one ΔVDD or alternatively decreased. For transmitting the bits, the whole voltage range 222 is available on the output signal voltage VOUT.

After the transmission of the bits 114, the output voltage VOUT in a further phase D is again in a HI-Z-state, which can be triggered by the fact that the internal or external adjustment means, respectively, terminates impressing the upper or lower data voltage value on the output signal voltage VOUT. In a further phase E, the analog output signal 116 of the output means is output again on the output signal voltage VOUT.

In phase A, the circuit can be in normal operating mode. If the component is to be placed into the test and/or configuration mode, it may be required to write a serial data word over the output line VOUT driven by the component. In FIG. 2, the serial data word is represented as a sequence of bits 114. Writing the serial data word is performed by applying a bit 114 of the serial data word, which corresponds to the ground reference value or the supply voltage VDD, depending on the logic value of the bit. Then, the bit 114 is adopted into a shift register (not shown in FIG. 2) in the component by a voltage pulse 112b on the supply line VDD.

Then, the circuit is in the configuration mode. Alternatively, it could also be possible that the circuit is already in the configuration mode in phase A. In that case, the transmitted data word does not serve to shift the circuit from normal operating mode into the configuration mode, but for reading in or reading out, respectively, data into or out of the circuit. In time periods where no bits are transmitted in the configuration mode, the analog output signal 116 of the output means is output as output signal voltage VOUT. If the circuit is a sensor circuit, the sensor output signal can also be evaluated further in the configuration mode.

According to this embodiment, a supply voltage pin is used as synchronization line, i.e. as clock line, by voltage modulation, and the sensor output is used as bidirectional data line with full signal swing for the data to be transmitted.

The advantage is now that the supply line VDD is used for synchronization of the data, which are transported on the output port VOUT in a physically separated way. If the output circuit is also embodied as open drain, with additional identification, the output pins could be interconnected and thus the transmission can be performed as three-wire bus. However, a digital sensor output may also be required therefore. Further, any protocols can be embedded.

An activation of the data transmission can be performed in the simplest case via a single clock pulse 112b on the supply line VDD. For improving the interference immunity, the same can be performed with a higher signal swing, or can be replaced by a certain number of pulses or pulses with a defined interval to improve the behavior against inadvertent activation. Other variations would be additional protection, for example by single pulsing during power-on or by clamping the output to a potential during power-on to prevent activation according to the above-described method.

For data transmission, any protocol where the clock is transmitted separately from the serial or bidirectional data, respectively, can be used, for example I²C or SPI.

According to one embodiment, the control means has an active mode for receiving and outputting bits 114, and an inactive mode where the control means is deactivated. Activation of the control means can take place via an activation signal (not shown in the figures), which the detector provides to the control means as result of a first trigger impulse 112a. In response to further trigger impulses 112b, the detector provides the trigger signal to the control means.

FIG. 3a shows a time representation of power-on of the circuit, for example an integrated circuit in the nominal case, i.e. when no data are transmitted.

After powering on the circuit, the supply voltage VDD rises from 0 Volt to the operating voltage value 5 Volt. According to this embodiment, the output signal voltage VOUT is actively driven by the output means in a first phase between 0.1 ms and 1 ms with the value of the supply voltage VDD, in this case 5 Volt. During this first phase, the component can perform initializations according to required application specifications. If the output means is a ratiometric driver, the same outputs 100% of the supply voltage as analog output voltage.

Figure 3B:
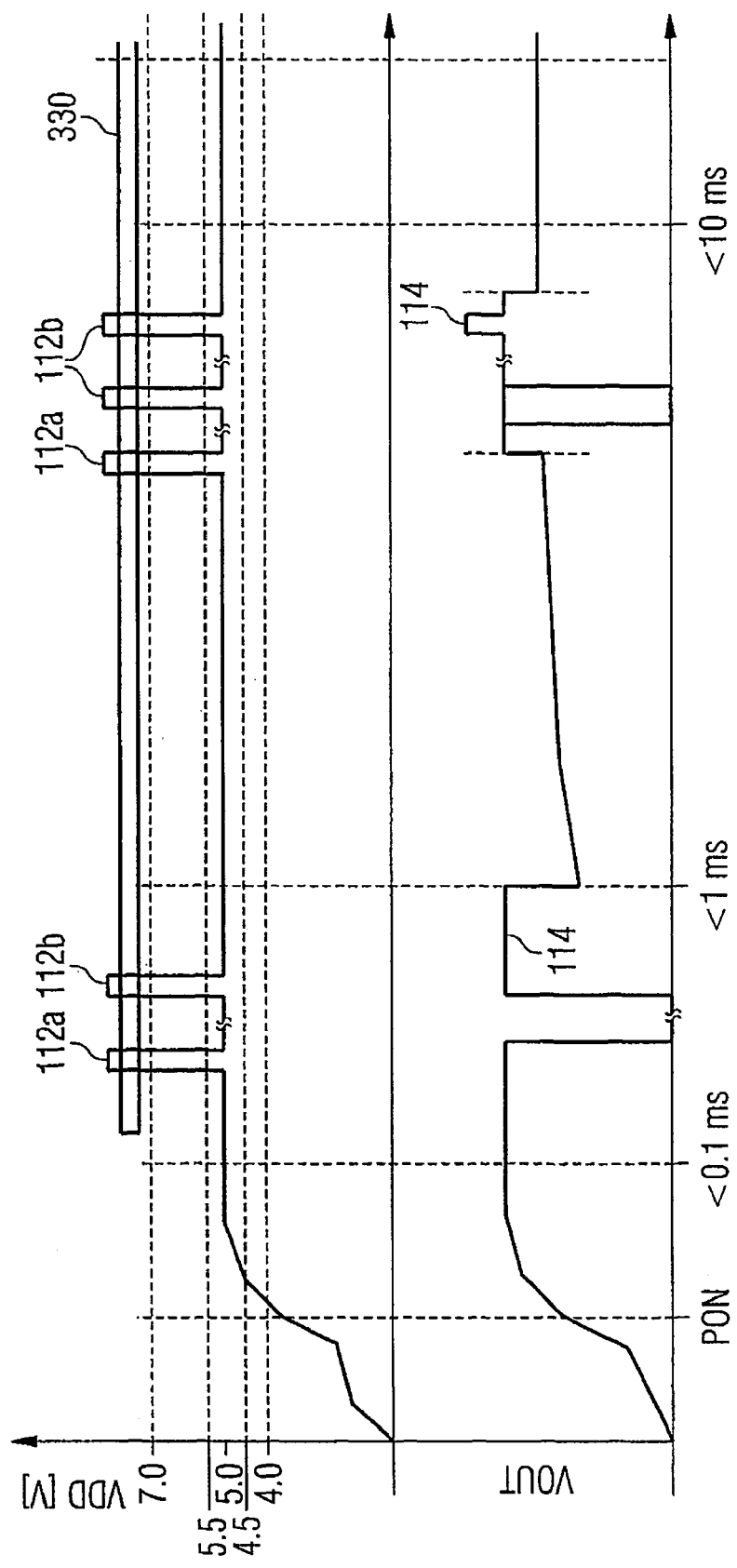

After 1 ms a measurement phase begins, where the output means no longer outputs the supply voltage, but an analog output signal, which represents the value of the circuit to be output. According to this embodiment, the analog output signal can have an invalid value in a time period between 1 ms and 10 ms, before it shows a correct value from a time period of 10 ms onwards after the power-on process. FIG. 3b shows the power-on process shown in FIG. 3a, where additionally data transmission takes place. In periods where data transmission takes place, merely schematically several of the trigger impulses 112a, 112b on the supply voltage VDD as well as several bits 114 on the output signal voltage are shown. During the first phase between 0.1 ms and 1 ms, the circuit, controlled with its own sequence control, expects the receipt of a configuration mode word, while the component may perform an initialization according to a required application specification. The configuration mode word is a sequence of a plurality of bits 114, which is compared with a predetermined activation word by the adjustment means, and, when matching, effects placing the circuit into the configuration mode.

According to one embodiment, the circuit can only be placed into the configuration mode during the first phase. During the first phase, the output signal voltage is driven to the operating voltage value, in this case 5 Volt, by the output means. In order to transmit the configuration mode word on the output signal voltage VOUT, an external driver has to exceed the high operating voltage value, in order to transmit a bit corresponding to a lower data voltage value. Since high power may be required for that, an erroneous activation of the configuration mode due to interference impulses on the output signal voltage is almost precluded.

According to this embodiment, a trigger impulse 112a, 112b has to exceed a voltage value of 7 V in order to be detected as trigger impulse by the detector. In order to preclude that the circuit is placed into the configuration mode after the first phase, an individual sequence control in the circuit can set an activation time 330, after expiry of which the detector is deactivated by an deactivation means (not shown in the figures) of the circuit, so that a detector can detect no further trigger impulses 112a, 112b or provides no trigger signal, respectively. In such a case, the activation time 330 shown in FIG. 3b would end at 1 ms. If the circuit is already in the configuration mode at the expiry of the activation time 330, the detector is not deactivated, since the following trigger impulses 112a, 112b are not used for placing the circuit into the configuration mode, but for data transmission in the configuration mode.

If the waiting mode 330 of such a parallel sequence control is terminated after a fixed time, the later activation of the test mode is fully eliminated. If the waiting mode is not terminated, placing the circuit into the test mode is possible at any time.

In the embodiment shown in FIG. 3b, the circuit had been placed into the test mode during the first phase. The waiting mode can, for example, be terminated after expiry of 20 ms after the power-on process.

In the second phase, data transmission takes place. Therefore, the output signal voltage VOUT is driven to the high data transmission voltage, in this case 5 Volt, for transmitting a first logic value of a bit, and to the low data transmission voltage, in this case 0 V, for transmitting a bit with a second logic state. If the output means is a ratiometric driver, which depends on the supply voltage of the circuit, then, during output of a bit by the internal adjustment means, the effect can occur that the upper data transmission voltage does not correspond to the general operating voltage of 5 V, but to the increased voltage of the trigger impulse of, in that case, 7 V. Thereby, the error liability during output of bits by the circuit can be further reduced, since the upper data transmission voltage is increased.

During further communication, overwriting the output value can also be deactivated, as long as a previous command word has been considered to be valid. This can possibly increase the transmission speed, if this may be required. In that case, the protection with common methods, such as parity protection and frame bits, is sufficient. In the error case, the mode is also left and the application mode is restored. Here, if necessary, a waiting time can be defined, after which the component automatically leaves this mode again, when no further word or only a trigger impulse has been sent.

According to one embodiment, the transmitted bits can comprise a security bit, for example a parity bit. In that case, the adjustment means can be implemented to check the received security bit and to provide an error signal in dependence on the check. As result of this error signal, the adjustment means can, for example, be implemented to place the circuit from the configuration mode back into the normal operating mode, but also to prevent placing the circuit into the configuration mode. Further, the adjustment means can be implemented to place the circuit from the configuration mode back into the normal operating mode, if no further trigger signal is provided by the detector within a predefined waiting time after a trigger signal.

Figure 4:
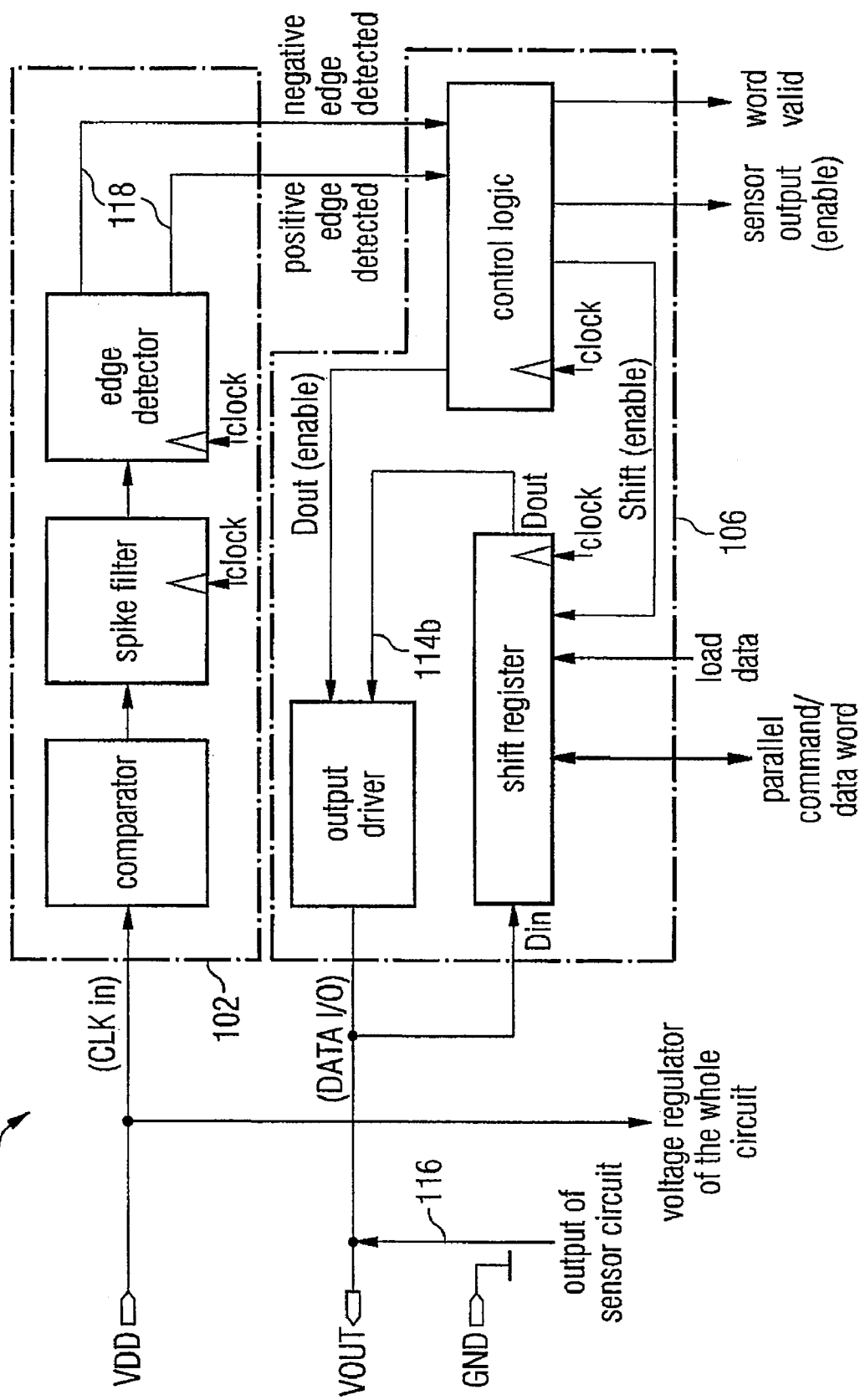
FIG. 4 is a block diagram of a circuit according to a further embodiment.

FIG. 4 shows a block diagram of a circuit 100 according to a further embodiment. The circuit 100 has a detector means 102 with a comparator, a spike filter and an edge detector. Further, the circuit 100 has an adjustment means 106 with a control logic, a shift register and an output driver. Further, the circuit has a first signal terminal for receiving the supply voltage, a second signal terminal for outputting the output signal voltage and a third signal terminal for receiving a ground potential GND. The supply voltage VDD is supplied both to a voltage regulator of the whole circuit and to the detector circuit 102, together with the trigger impulses representing an input clock. The second signal terminal for outputting the output signal voltage VOUT is connected both to an output of the sensor circuit providing the analog output signal 116 and the adjustment means 106.

The comparator is implemented for comparing the supply voltage via reference for detecting VDD and VDD+ΔV, which corresponds to a trigger impulse. Additionally, the comparator can be implemented with hysteresis, which means represent a Schmitt trigger. The spike filter is implemented to remove undesired pulses exceeding a maximum frequency, so-called spikes. This block can be omitted when the supply voltage change during a trigger impulse is sufficiently high and thus sufficient interference immunity is given. This filter can be implemented analogously or digitally. A shift register is common, which compares the inserted bits by voting, which means performs a majority decision. The edge detector provides pulses in the width of the system clock, which passes a detected rising edge or falling edge of a trigger impulse on to the control logic. Such pulses correspond to the trigger signal 118.

The control logic of the adjustment means 106 performs deactivation of the output of the sensor circuit and the output driver, activating the shift register or indicating the validity of a received data word corresponding to the used protocol. The shift register performs serial parallel conversion of transmitted/received data. The output driver is a deactivatable driver, possibly with open drain or open collector stage for serially outputting data.

According to one embodiment, the circuit 100 has a memory means in the form of the shift register shown in FIG. 4, or in the form of a further memory to which data from the shift register are read in or are written into the shift register, respectively, via a parallel command/data word. In the configuration mode, the adjustment means 106 is implemented to write a logic value of a received bit into the memory means, or to read out a logic value of a bit stored in the memory means and to output the same as bit 114b. The output driver of the adjustment means 106 can be a push pull driver.

The output of the sensor circuit, which means the output means of the circuit, can be an operation amplifier with ratiometric behavior, comparable with a potentiometer, which outputs a ratiometric analog signal. This can, for example, be a rail-to-rail output amplifier. In a ratiometric output, the output voltage is the higher, the higher the reference voltage is, in this case the operating voltage VDD. In that case, the ratiometric output signal can assume a voltage value which lies within a margin defined by two points, in this case 0 V and VDD.

Figure 5:
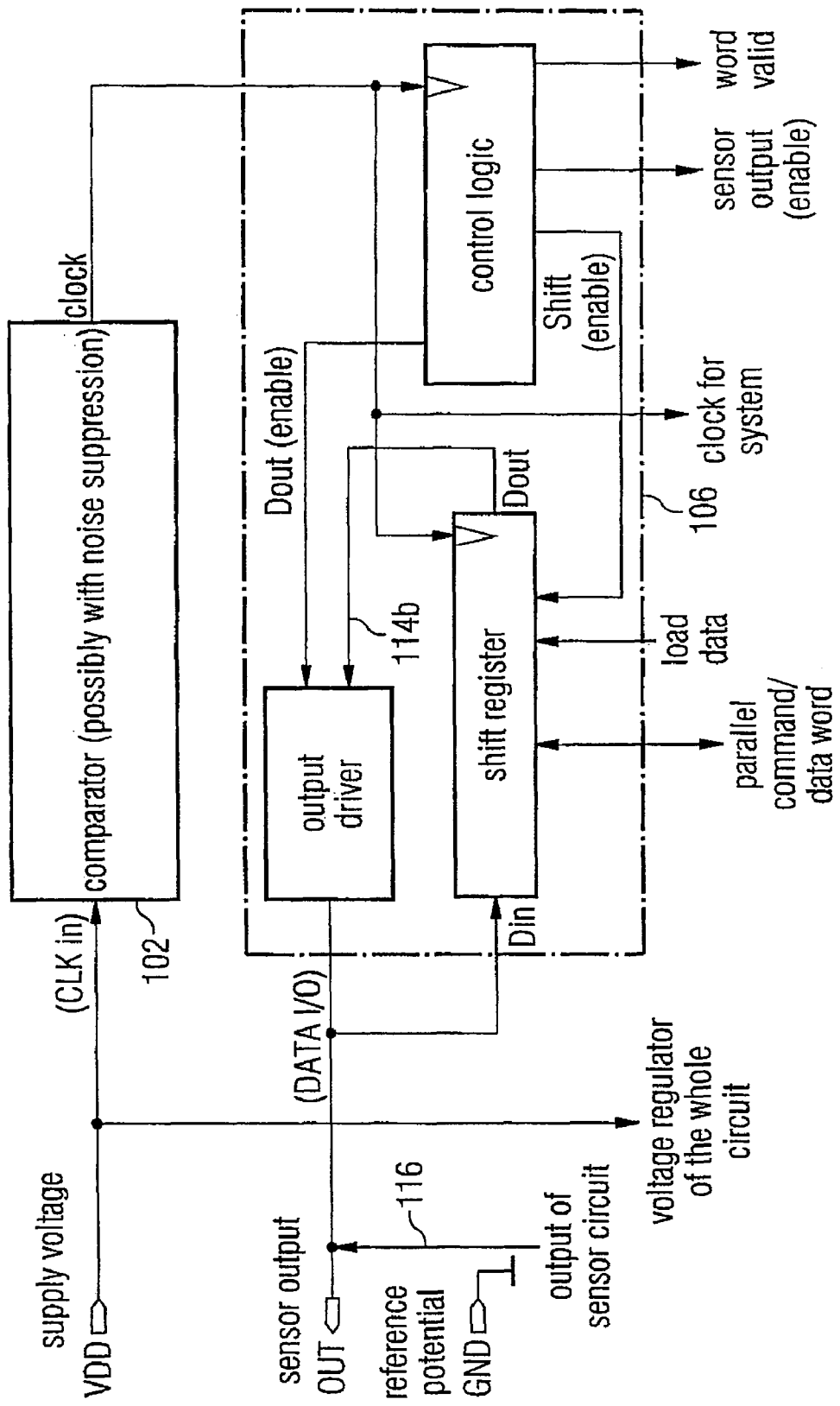
FIG. 5 is a block diagram of a circuit according to a further embodiment.

FIG. 5 shows a block diagram of a circuit 100 according to a further embodiment. Contrary to the embodiment shown in FIG. 4, the circuit 100 has no internal clock generator for providing a clock. According to this embodiment, the clock for the system is derived from the trigger impulses, which are superimposed on the supply voltage VDD. If the circuit 100 also requires a clock during the normal operating mode, trigger impulses are continuously superimposed on the supply voltage. If, however, it is sufficient that the circuit 100 receives a clock only in the configuration mode or only for data transmission, it is sufficient to superimpose clock impulses on the supply voltage VDD only during these specific phases.

Instead of the shift register shown in FIG. 4, a more complex circuit (not shown in the figure) and a more complex protocol can be used.

A more complex protocol increases the error protection of the transmission. For example, the serial date to be transmitted can be protected internally with frame bits or free bits, where, for example, the first and last bit always represents a "1", by parity bits and similar common methods. Further error protection is given when only a small defined set of possible command codes represents valid mode activation words. If, for example, words with a bit length of 21 bits are used, there are $m=2^{21}$ possibilities, which means approximately 2.1 million possibilities for possible activation words. According to one embodiment, for example, only n=10 words are valid activation commands or valid commands, respectively. Thus, the possibility of erroneously activating a mode is n/m=10/2,100,000=<5 ppm. This low probability is only achieved by defining redundant words. Thus, a small number of possibilities and a large word width are advantageous.

FIGS. 6a-6c show possible frames containing a 16 bit word. FIG. 6a shows a command frame, which means, for example, a frame including a command placing the circuit into the configuration mode. FIG. 6b shows an input data frame used to transmit data bits to the circuit. FIG. 6c shows a general format of an output data frame that can be used for outputting data. This frame can be emitted synchronously or asynchronously. In contrary, the frame for receiving data can only be emitted synchronously.

A data frame contains a 16-bit data word. In contrast, a command frame contains a command and optionally an address word.

According to this embodiment, a frame always consists of 21 bits. A frame always begins and ends with a "1", a so-called frame bit. The least significant bit LSB of a frame to be transmitted is read in first. The least significant bit of a result frame is output first. When the circuit, for example, the IC, is locked, i.e. is in normal operating mode, an asynchronous command has to be sent to the circuit within 20 ms after power-on of the voltage supply, to allow reading out internal circuit parameters or memory values. Otherwise, the circuit is fully in its application mode and the interface for communication is disabled. The whole frame, including the frame bits, is protected with even positional and odd positional parity bits. The time gap between two adjacent frames must be less than the allowed watchdog period.

Every mismatch to the above conditions disables the interface. The IC falls back to its application mode. This is a protecting mechanism to prevent any other than normal operation mode in the field.

The parity bits PE/PO for command and data transmission are calculated as follows. The most significant bit is referred to as bit 20 and the least significant bit as bit 0. Bits in between are numbered accordingly. The PE (bit 17) and the PO (bit 18) are set such that the following conditions hold:

Bit0 XOR Bit2 XOR Bit4 XOR . . . XOR Bit20=0

Bit1 XOR Bit3 XOR Bit5 XOR . . . XOR Bit19=0.

Thus, the number of "1"s in even positions, including the PE-bits is even, and the number of "1"s in odd positions, including the PO-bits, is even.

The PE/PO-bits for a given data block can be calculated as follows, wherein the data block is organized such that D0 represents the least significant bit and D15 the most significant bit. For a command, the data block is represented as "CMD+0x80+ADDR*256":

PE=DATA(0) xor DATA(2) xor ... xor DATA(14) xor 1 for a command frame

PE=DATA(0) xor DATA(2) xor ... xor DATA(14) for a data frame

PE=DATA(1) xor DATA(3) xor ... xor DATA(15) for any frame.

Alternatively, any other protocols and frame formats can be used.

FIG. 7 shows a possible parity generator, as can be realized in programmable hardware.

The approach here offers a mechanism for transmitting sensor-internal digital data for test and/or calibration or for configuration of a parameter memory of sensors with the aid of only three terminals. Thereby, supply voltage modulation for transmitting a bit clock is used. Transmission of data is performed in serial format by using a signal swing of any size, this offers high interference suppression. Activating the data transmission is performed via an initialization pulse or pulses for switching the sensor from operating mode to the data-I/O-mode. Switching back is performed automatically at the end of the protocol or possibly after a time-out. A connection with any transmission protocol, which is based on separate clock transmission plus serial bidirectional data transmission is possible.

The usage of the mechanism allows, for example, in a linear Hall sensor, reading out temperature and flow density ADC, and describing the output digital/analog converter. Further, a parameter memory (EEPROM) of a component can be programmed. Additionally, the approach here can also be used for scan path testing.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit, comprising:
    a supply voltage terminal configured to receive a supply voltage of the circuit, wherein a trigger impulse is superimposed on the supply voltage;
    a signal terminal configured to output an output signal voltage of the circuit, wherein a bit of a data signal is superimposed on the output signal voltage;
    a detector configured to detect the trigger impulse and configured to provide a trigger signal in response to the trigger impulse; and
    an adjuster, which is implemented to extract the bit from the output signal voltage in response to the trigger signal in order to receive the bit and, configured to output a bit, superimpose the output signal voltage with the bit of the data signal in order to output the bit,
    wherein the adjuster configured to output the bit is implemented to impress an upper data voltage value on the output signal voltage when the bit to be output has a first logic value, and to impress a lower data voltage value on the output signal voltage when the bit has a second logic value.

2. The circuit according to claim 1, further comprising:
    an output, which is implemented to provide an analog output signal of the circuit in the form of the output signal voltage at the signal terminal; and
    a coupler, which is implemented to couple the adjuster with the analog output signal.

3. The circuit according to claim 2,
    wherein the output is implemented to output a supply voltage value as output signal voltage for a predefined power-on period, as soon as the supply voltage has the supply voltage value, and
    wherein the detector is implemented to detect the trigger impulse during the power-on period.

4. The circuit according to claim 2, wherein the output is a rail-to-rail output amplifier with ratiometric behavior, and the analog output signal is a ratiometric analog signal.

5. The circuit according to claim 2, wherein the circuit is a sensor circuit for detecting a measurement quantity, and wherein the analog output signal corresponds to the detected measurement quantity.

6. The circuit according to claim 1, wherein
    the supply voltage is increased by the trigger impulse, and
    the detector is implemented to provide the trigger signal when the supply voltage exceeds a trigger voltage value.

7. The circuit according to claim 1, wherein the adjuster for receiving the bit is performed to provide a first logic value to the circuit when the output signal voltage has an upper data voltage value or exceeds the same, and to provide a second logic value when the output signal voltage has a lower data voltage value or falls below the same.

8. The circuit according to claim 1,
    wherein the controller has an active mode for receiving and outputting the bit, and an inactive mode wherein the controller is disabled, and
    wherein the detector is further implemented to provide an activation signal to the adjuster for placing the adjuster into the active mode, in response to a first trigger impulse, and to provide the trigger signal in response to a further trigger impulse.

9. The circuit according to claim 1, wherein the data signal has a plurality of successive bits, and wherein the adjuster is implemented to respectively receive or output one of the bits in response to the trigger signal.

10. The circuit according to claim 1, wherein the adjuster has a push-pull driver for superimposing the bit on the output signal voltage.

11. The circuit according to claim 1, wherein the circuit only has one further input for receiving a ground signal.

12. The circuit according to claim 1, further comprising:
    an output terminal; and
    a sensor unit generating an analog sensor signal,
    wherein the circuit is operable to either output the analog sensor signal or the data signal at the output terminal.

13. A circuit, comprising:
    a supply voltage terminal configured to receive a supply voltage of the circuit, wherein a trigger impulse is superimposed on the supply voltage;
    a signal terminal configured to output an output signal voltage of the circuit, wherein a bit of a data signal is superimposed on the output signal voltage;
    a detector configured to detect the trigger impulse and for providing a trigger signal in response to the trigger impulse; and
    an adjuster, which is implemented to extract the bit from the output signal voltage in response to the trigger signal in order to receive the bit or to superimpose the output signal voltage with the bit of the data signal in order to output the bit, wherein the data signal has a plurality of successive bits, and wherein the adjuster is implemented to respectively receive or output one of the bits in response to the trigger signal, wherein the circuit has a normal operating mode and a configuration mode, and wherein the adjuster is implemented to compare received bits with a predetermined activation word, and to place the circuit into the configuration mode in dependence on the comparison.

14. The circuit according to claim 13, wherein the circuit has a memory, and wherein the adjuster is implemented to write a logic value of a received bit into the memory in the configuration mode, or to read out a logic value of a bit stored in the memory, and to output the same as bit.

15. The circuit according to claim 13, wherein the adjuster is implemented to place the circuit into the normal operating mode, when no further trigger signal is provided by the detector within a predefined waiting time after a trigger signal.

16. The circuit according to claim 13, wherein the circuit has a deactivator, which is implemented to deactivate the detector, when the circuit is still in the normal operating mode after a predefined activation time.

17. A circuit, comprising:
a supply voltage terminal configured to receive a supply voltage of the circuit, wherein a trigger impulse is superimposed on the supply voltage;
a signal terminal configured to output an output signal voltage of the circuit, wherein a bit of a data signal is superimposed on the output signal voltage;
a detector configured to detect the trigger impulse and configured to provide a trigger signal in response to the trigger impulse; and
an adjuster, which is implemented to extract the bit from the output signal voltage in response to the trigger signal in order to receive the bit or to superimpose the output signal voltage with the bit of the data signal in order to output the bit, wherein the data signal has a plurality of successive bits, and wherein the adjuster is implemented to respectively receive or output one of the bits in response to the trigger signal, wherein the plurality of bits has a security bit, and wherein the adjuster is implemented to check a received security bit and to provide an error signal in dependence on the check.

18. The circuit according to claim 17, wherein the adjuster is implemented to place the circuit into the normal operating mode in response to the error signal.

19. A method comprising:
a) receiving a supply voltage of a circuit via a supply voltage terminal, wherein a trigger impulse is superimposed on the supply voltage;
b) outputting an output signal voltage of the circuit via a signal terminal of the circuit, wherein a bit of a data signal is superimposed on the output signal voltage;
c) detecting the trigger impulse and providing a trigger signal in response to the trigger impulse; and
d) extracting the bit from the output signal voltage in response to the trigger signal in order to receive the bit, and superimposing the output signal voltage with the bit in order to output the bit,
wherein superimposing comprises impressing an upper data voltage value on the output signal voltage when the bit to be output has a first logic value, and impressing a lower data voltage value on the output signal voltage when the bit has a second logic value.

* * * * *